(12) United States Patent
Krönke et al.

(10) Patent No.: US 7,439,186 B2
(45) Date of Patent: Oct. 21, 2008

(54) METHOD FOR STRUCTURING A SILICON LAYER

(75) Inventors: Matthias Krönke, Dresden (DE); Laura Lazar, Munich (DE)

(73) Assignee: Infineon Technologies AG, Munich (DE)

( * ) Notice: Subject to any disclaimer, the term of this patent is extended or adjusted under 35 U.S.C. 154(b) by 761 days.

(21) Appl. No.: 10/463,565

(22) Filed: Jun. 16, 2003

(65) Prior Publication Data

US 2004/0005778 A1 Jan. 8, 2004

(30) Foreign Application Priority Data

Jun. 14, 2002 (DE) ................. 102 26 604

(51) Int. Cl.
*H01L 21/302* (2006.01)
(52) U.S. Cl. .................. 438/706; 438/719; 438/725; 438/738
(58) Field of Classification Search ................ 438/706, 438/725, 727, 735, 738, 719
See application file for complete search history.

(56) References Cited

U.S. PATENT DOCUMENTS

| 5,007,982 | A | | 4/1991 | Tsou | |
|---|---|---|---|---|---|
| 5,246,529 | A | * | 9/1993 | Fukasawa et al. | ........... 438/709 |
| 5,423,941 | A | | 6/1995 | Komura et al. | |
| 5,767,018 | A | | 6/1998 | Bell | |
| 5,792,693 | A | | 8/1998 | Tseng | |
| 5,933,748 | A | * | 8/1999 | Chou et al. | .................. 438/431 |
| 6,127,278 | A | | 10/2000 | Wang et al. | |
| 6,136,211 | A | | 10/2000 | Qian et al. | |
| 6,165,695 | A | | 12/2000 | Yang et al. | |
| 6,235,214 | B1 | | 5/2001 | Deshmukh et al. | |
| 6,461,969 | B1 | * | 10/2002 | Lee et al. | ..................... 438/706 |
| 6,482,701 | B1 | | 11/2002 | Ishikawa et al. | |
| 6,544,838 | B2 | * | 4/2003 | Ranade et al. | ............... 438/244 |
| 6,680,232 | B2 | * | 1/2004 | Grebs et al. | .................. 438/270 |
| 2001/0023960 | A1 | * | 9/2001 | Soga et al. | .................... 257/330 |
| 2002/0132422 | A1 | * | 9/2002 | Ranade et al. | ............... 438/243 |
| 2003/0189024 | A1 | * | 10/2003 | Khan et al. | ..................... 216/2 |

FOREIGN PATENT DOCUMENTS

| DE | 101 27 888 | | 12/2002 |
|---|---|---|---|
| JP | 04196315 | | 7/1992 |
| JP | 11-135489 | * | 5/1999 |
| JP | 2001044216 | | 2/2001 |

OTHER PUBLICATIONS

*Patent Abstract of Japan* for Japanese 03141640 of Jun. 17, 1991.
*Patent Abstract of Japan* for Japanese 09134862 of May 20, 1997.

* cited by examiner

*Primary Examiner*—Thanh Nguyen
(74) *Attorney, Agent, or Firm*—Schiff Hardin LLP (57) ABSTRACT

A method for structuring a silicon layer applies lacquer mask onto the silicon layer, and the silicon layer is selectively etched relative to the lacquer mask using an etching gas mixture comprising $SF_6$, HBr and $He/O_2$. The openings etched into the silicon layer with this method comprise especially steep sidewalls. Over and above this, the etching selectivity relative to a lacquer mask is clearly improved.

18 Claims, 8 Drawing Sheets

METHOD FOR STRUCTURING A SILICON LAYER

BACKGROUND OF THE INVENTION

1. Field of the Invention

The invention is in the field of manufacturing integrated circuits and is directed to a method for structuring a silicon layer and, in particular, to a method for structuring a layer using a hard mask composed of silicon.

2. Description of the Related Art

Structuring of layers usually utilizes a mask that is applied onto the layer to be structured and leaves those regions of the layer to be structured uncovered that are to be eroded by a subsequent etching.

Masks can be fundamentally divided into two main groups. Lacquer masks, which form the first group, are relatively sensitive to mechanical erosion. Moreover, they frequently do not exhibit any high temperature stability. However, they can be easily manufactured and structured. Another advantage of lacquer masks is that they can be composed of a radiation-sensitive material, particularly of a photoresist, and can thus be directly lithographically structured.

In comparison, hard masks are composed of a comparatively temperature-stable and hard material. These masks exhibit greater resistance to mechanical erosion. Hard masks exhibit a comparatively slight erosion particularly in view of anisotropic etching methods that directly bombard the structure with reactive molecules or atoms. As a result, the structures fashioned in the hard mask can be transferred to the layer to be structured with greater dimensional accuracy.

Hard masks must usually be structured with lacquer masks first before they can be employed as mask.

The employment of a hard mask of amorphous silicon for forming via holes between metallization levels ("vias") is disclosed, for example, by U.S. Pat. No. 6,165,695. The amorphous silicon is first selectively etched relative to a lacquer mask using magnetically enhanced relative ion etching (MERIE) utilizing $Cl_2$ and HBr. The structural transfer from lacquer mask onto the amorphous silicon, however, is not very satisfactory.

Other etching methods are also known for etching silicon relative to lacquer layers. Thus, U.S. Pat. No. 6,235,214 B1 discloses the single-stage etching with an $SF_6/O_2/CHF_3$ mix or the two-stage etching with an $SF_6/O_2/CHF_3$ mix and an $SF_6/O_2$ mix. In contrast, an $HBr/Cl_2/He$—$O_2$ mix is employed according to U.S. Pat. No. 5,767,018. An $HBr/Cl_2/He$—$O_2$ mix is likewise employed in U.S. Pat. No. 6,136,211 for etching polysilicon. Other etching methods employ an $NF_3/HBr$ mix.

These methods, however, are only conditionally suitable for future structure sizes that lie in the range of 140 nm and below, since the selectivity between the lacquer mask and silicon in these methods is often low and—over and above this—the etching leads to sidewalls having a slope that cannot be controlled or can only be controlled with great difficulty. However, an improved structure transfer from the lacquer mask onto the silicon layer is needed for the small structures that have been mentioned.

SUMMARY OF THE INVENTION

The present invention is therefore based on the object of providing a method for structuring a silicon layer that enables an adequate selectivity when etching relative to a lacquer mask and enables an improved structure transfer from the lacquer mask onto the silicon layer. This object is achieved according to the method described below.

A method for structuring a silicon layer is inventively provided that comprises applying a lacquer mask onto the silicon layer, and selectively etching the silicon layer relative to the lacquer mask using an etching gas mixture comprising $SF_6$, HBr and $He/O_2$.

DESCRIPTION OF THE DRAWINGS

The invention is explained in greater detail on the basis of an exemplary embodiment below and shown in the Figures.

DETAILED DESCRIPTION OF THE PREFERRED EMBODIMENTS

A silicon layer, particularly a polysilicon layer, can be etched with adequate selectivity relative to a lacquer mask using the inventive method. This selectivity achieves values of 4.5:1 (silicon: lacquer mask) and above. Moreover, the sidewalls of the openings etched in the silicon layer exhibit nearly no angle of incidence, i.e., sidewalls that proceed essentially vertically are formed. The structure transfer from lacquer layer onto silicon layer is thus very good. Since the sidewalls proceed nearly vertically, comparatively thick silicon layers can also be etched. It is thus possible to structure silicon layers that are up to 500 nm thick. As a result, for example, correspondingly thick hard masks can also be produced from the silicon layer. In view of future structure sizes of 140 nm and below (for example, 110 nm), this means that the openings in the silicon layer employed as hard mask can comprise an aspect ratio of more than 4:1 (depth of the opening : width of the opening). Due to the steepness of the sidewalls, the openings penetrating the silicon layer comprises nearly the same crossection at both their upper end as well as at their lower end. The "critical dimension" is the same.

Over and above this, the slope of the sidewalls can be set via the setting of the electrical power supplied during etching. An inductively coupled plasma etching process (TCP) may therefore preferably be employed. The inductively applied power preferably lies between 400 and 800 W, particularly at 600 W. Further, a bias power of between 40 and 100 W, particularly of 50 W, is supplied, for example, into the lower electrode on which the substrate to be etched usually lies. The steepness of the sidewalls or slopes of the openings etched into the silicon layer can be set to desired sizes by varying these two values.

When etching the silicon layer, the flow of $SF_6$ is preferably set between 3 and 7 sccm, particularly to 5 sccm. The flow of HBr is likewise preferably set between 170 and 210 sccm, particularly to 190 sccm, when etching the silicon layer. Over and above this, the flow of $He/O_2$ is preferably set between 8 and 12 sccm, particularly to 10 sccm, when etching the silicon layer. The preferred pressure when etching the silicon layer lies between 5 and 15 Pa, particularly at 10 Pa.

Especially steep sidewalls given simultaneously high selectivity relative to the lacquer mask can be achieved by selecting appropriate values from the previously mentioned ranges.

It is especially preferred that the silicon layer or the polysilicon layer is etched with an etching gas mixture that contains only $SF_6$, HBr and $He/O_2$. Especially good results can thus be achieved. The $He/O_2$ is preferably a mixture having 70% He and 30 $O_2$.

The individual etching substances serve different purposes. HBr represents the principal etching substance, i.e., the silicon is chemically attacked and eroded essentially by HBr. At the same time, the steepness of the etched sidewalls can be set by the amount of supplied HBr (flow of HBr). $He/O_2$ primarily serves for the passivation of the uncovered sidewalls in order to protect these against an attack by HBr. Although $He/O_2$ likewise passivates the silicon uncovered at the floor of the opening etched in the silicon layer, this passivation is clearly less resistant to the HBr attack than at the sidewalls due to the high anisotropy of the etching. In contrast, the critical dimension can be adapted with $SF_6$, i.e., the extent to which a structure transfer satisfactorily ensues. Given a reduction of $SF_6$, the openings etched into the silicon layer become increasingly smaller. In contrast, the anisotropy is improved given an increase. However, a reduction of the selectivity is simultaneously observed.

An organic anti-reflection layer is preferably applied onto the silicon layer and selectively etched relative to the lacquer mask before the application of the lacquer mask.

Advantageously, the anti-reflection layer is selectively etched relative to the lacquer layer using an etching gas comprising $CF_4$. The flow of $CF_4$ can be set to between 80 and 120 sccm, particularly to 100 sccm. The preferred pressure when etching the anti-reflection layer lies between 5 and 10 Pa, particularly at 7 Pa. In particular, the anti-reflection layer may be etched with $CF_4$.

The etching of the silicon layer and/or of the anti-reflection layer can be respectively implemented in one, two or a plurality of etching steps. The composition of the respective etching gas can be modified between the individual etching steps. An end point recognition can be particularly utilized in the etching of the silicon layer and/or of the anti-reflection layer.

A further advantage of the inventive method is that the silicon layer can be employed as hard mask for the structuring of a layer. A suitable method for this may comprise, for example, the following steps: applying the silicon layer onto the layer to be structured, applying the lacquer mask onto the silicon layer, selectively etching the silicon layer relative to the lacquer mask using the etching gas mixture comprising $SF_6$, HBr and $He/O_2$, whereby a hard mask arises from the silicon layer, and etching the layer to be structured using the hard mask.

It is especially preferred that the lacquer mask is removed before the etching of the layer to be structured—this improves the aspect ratio in the etching of the layer to be structured. Moreover, contamination due to substances contained in the lacquer mask, particularly carbon, are avoided. Particularly carbon has a disadvantageous effect in the etching of the layer to be structured.

The silicon layer is thereby etched with the method described above. As warranted, an anti-reflection layer can be arranged on the silicon layer. The etched silicon layer serves as hard mask in the subsequent etching of the layer to be structured.

The inventive method is especially suited for structuring a layer that covers a semiconductor substrate into which field effect transistors are integrated, where via holes to gate structures and to doping zones arranged in the substrate are etched into the layer to be structured. In this case, via holes may be formed directly to the semiconductor substrate or directly to gate structures. What are consequently involved are the via holes between the first wiring level above the transistor structures, in which, for example, bit lines are formed in the case of semiconductor memories (the "M0 level"), and the substrate or the gate structures. The openings etched into the silicon layer define the lay both of the gate structures as well as of the via holes leading to the doping zones, where are openings of the silicon layer are etched with the assistance of a single lacquer mask.

As a result, all openings in the silicon layer are aligned relative to one another so that only a single hard mask is required in the subsequent etching of the via holes upon employment of the silicon layer serving as hard mask. All openings or via holes can accordingly be produced using a single lithographic exposure step. The hard mask composed of silicon, accordingly, is the mask that provides the structure for all via holes.

The inventive method is also especially suitable for etching via holes with a high aspect ratio. The employment of a thin hard mask may reduce the overall aspect ratio of via hole and mask in the via hole etching compared to an etching with a considerably thicker lacquer mask. The hard mask of silicon is therefore preferably fashioned less than 180 nm, particularly with a thickness of about 85 nm.

The etching of the via holes to the gate structures and the doping zones preferably ensues in two etching steps in which individual openings of the silicon layer are covered with an auxiliary layer in at least one of the etching steps. A selection of the via holes to be respectively etched is thus possible given simultaneously employment of a single structuring etching mask, which is formed here by the etching mask composed of silicon or polysilicon.

The inventive method is especially advantageously suited for the manufacture of semiconductor memories that comprise at least one cell field and a peripheral region. Individual memory cells are regularly arranged in the cell field, where each memory cell comprises, for example, a storage capacitor and a selection transistor. The peripheral region serves for the drive of the memory cells and for processing the information stored in the memory cells. Field effect transistors may typically be arranged both in the cell field as well as in the peripheral region. Via holes to gate structures and doping zones both in the cell field as well as in the peripheral region can be manufactured in a simple and dependable way, where only the hard mask composed of silicon is required for all via holes.

Figure 1A:
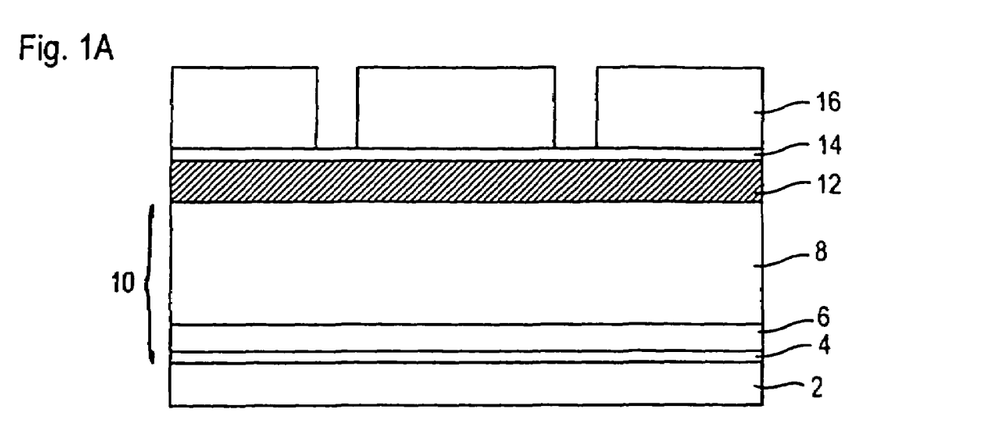
FIGS. 1A-1C are cross sectional views illustrating the stages of the inventive method.
Figure 1B:
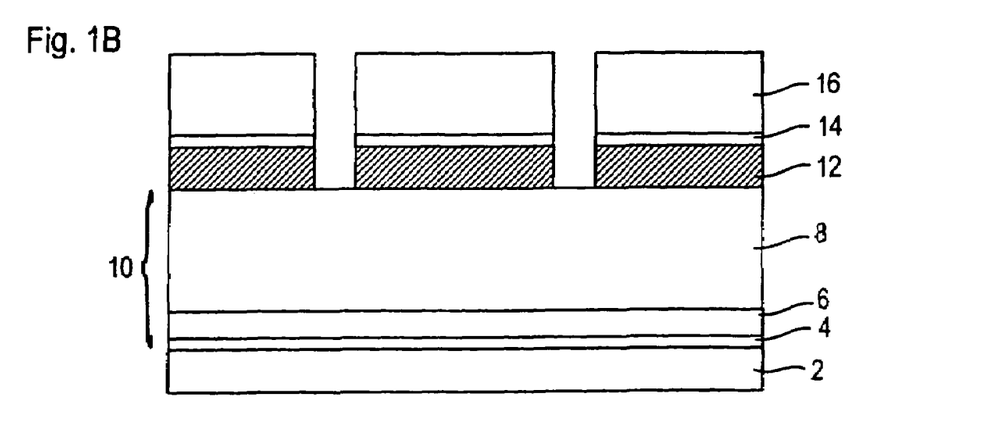
Figure 1C:
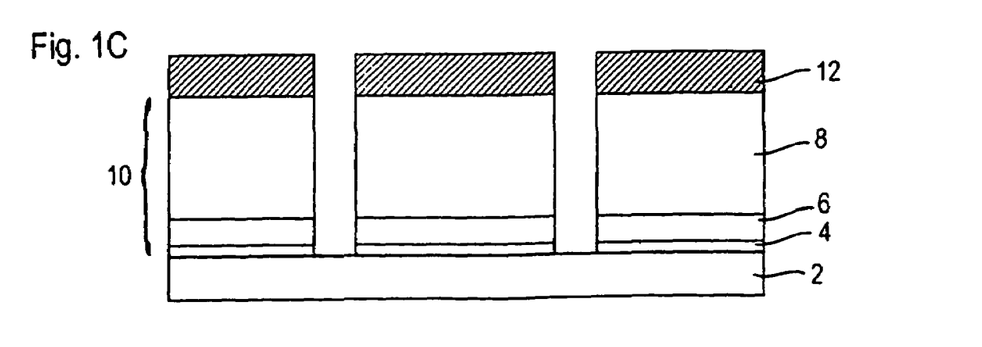

Referring to the figures illustrating preferred embodiments, FIGS. 1A-1C show a substrate of, for example, monocrystalline silicon on which a pad oxide 4 of silicon oxide and a pad nitride 6 of silicon nitride are situated. A thick layer of boron glass layer (BSG) is seated on the pad nitride 6. In this exemplary embodiment, the layers 4, 6 and 8 represent the layer 10 to be structured. An approximately 250 nm thick polycrystalline layer 12 is deposited onto the BSG layer 8, followed by an approximately 80 nm thick organic anti-reflection coat (ARC) 14. A lacquers layer (photoresist) 16 that has already been structured is applied onto the ARC layer 14. The lacquer layer 16 serves as a mask for the subsequent structuring of the ARC layer 14 and polysilicon layer 16.

Both layers are etched in a transmission coupled plasma (TCP) chamber. $CF_4$ is employed for etching the ARC layer 14, and an etching gas mixture of $SF_6$, HBr and $He/O_2$ is employed for etching the polysilicon layer 12. FIG. 1B shows the etched ARC layer 14 and the polysilicon layer 12. FIG. 1C shows the etching of the BSG layer 8, of the pad nitride 6 and of the pad oxide 4 upon employment of the polysilicon layer 12 as a hard mask. The lacquer mask and the anti-reflection coat 14 are removed before the etching of the layer 10. As warranted, these layers are not eroded until during the etching.

An embodiment of the inventive method is explained in greater detail below on the basis of the manufacture of an integrated semiconductor memory that is shown in FIGS. 2A through 2D.

This exemplary embodiment partially relates to German Patent Application DE 101 27 888.8 filed Jun. 8, 2001, and published on Dec. 19, 2002, titled "Verfahren zur Bildung von Kontaktregionen von in einem Substrat integrierten Bauelement", herein incorporated by reference.

Figure 2A:
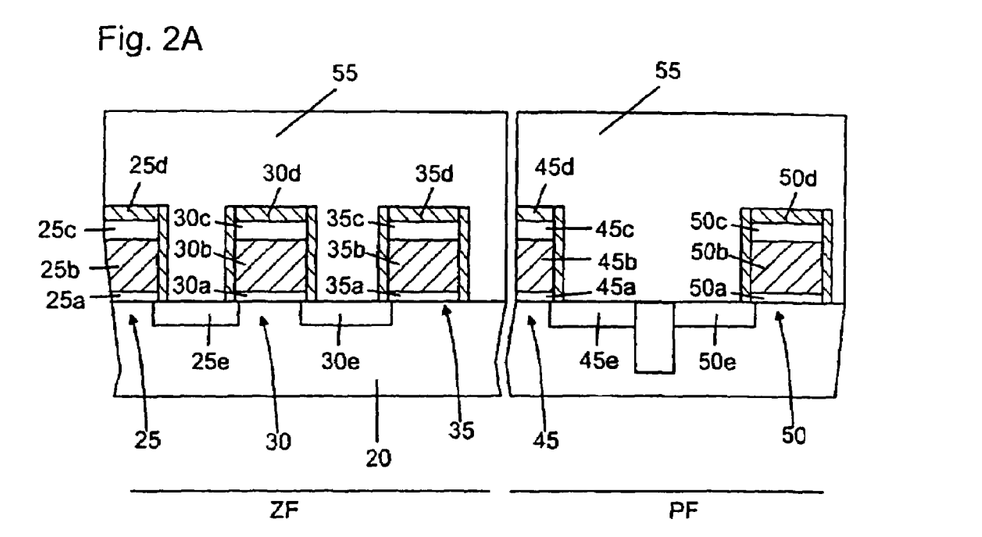
FIGS. 2A-2D are cross sectional views illustrating stages of the inventive method with respect to manufacturing an integrated semiconductor memory.

A plurality of field effect transistors 25, 30, 35, 45 and 50 are integrated in a semiconductor substrate 20 of monocrystalline silicon. The field effect transistors 25, 30 and 35, which serve as selection transistors, are located in the cell field ZF, whereas the field effect transistors 45 and 50 are arranged in the peripheral region PF. The storage capacitors in the cell field have not been shown for reasons of clarity. The storage capacitors are preferably fashioned in the form of trench capacitors, i.e., they comprise the form of a trench extending into the depth of the semiconductor substrate.

The field effect transistors comprise gate structures 25, 30, 35, 45, 50 that are composed of a layer stack. The gate dielectric 25$a$, 30$a$, 35$a$, 45$a$ and 50$a$, which can, for example, be composed of silicon oxide, is situated directly on the substrate. The gate electrode is arranged thereover and this can, for example, comprise a polysilicon layer 25$b$, 30$b$, 35$b$, 45$b$ and 50$b$ and a silicide layer 25$c$, 30$c$, 35$c$, 45$c$ and 50$c$ of, for example, tungsten silicide. These layers are completely covered by, for example, a silicon nitride layer 25$d$, 30$d$, 35$d$, 45$d$ and 50$d$. The doping zones 25$e$, 30$e$, 45$e$ and 50$e$ are situated laterally next to the previously mentioned layer stacks. One doping zone 25$e$ is often allocated to two field effect transistors in the cell field ZF. In the peripheral region PF, in contrast, each field effect transistor 45, 50 comprises its own doping zones 45$e$, 50$e$. The doping zones represent the source and drain regions of the field effect transistors.

Figure 2B:
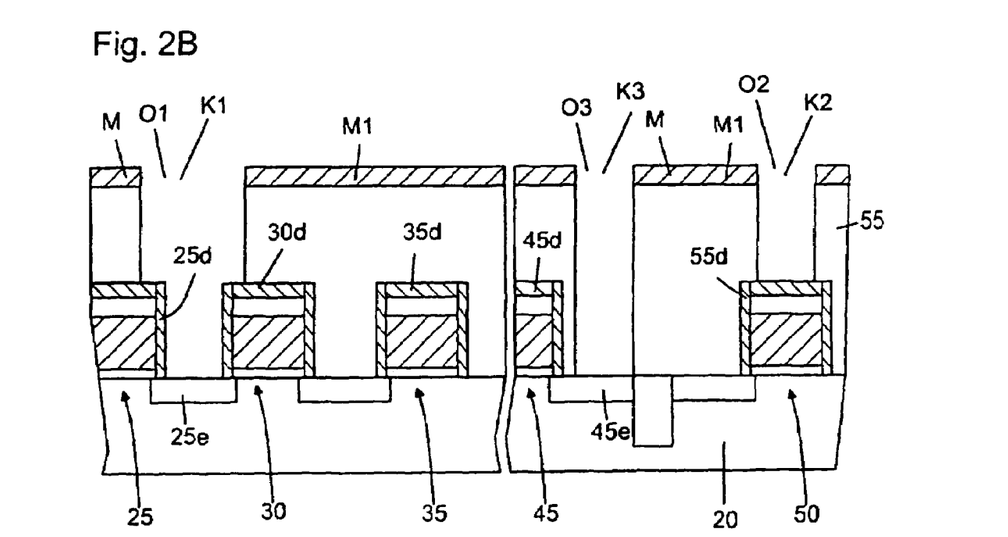

The entire semiconductor substrate 20 including the gate structures is covered with an insulating layer 55 in a planar fashion. This represents the layer to be structured in the exemplary embodiment. A polysilicon layer M is applied onto the insulation layer 55 and may be structured using a lacquer mask (not shown here), so that a hard mask M arises from the polysilicon layer M. The polysilicon layer M comprises openings O1, O2 and O3 at the locations at which via holes K1 ("CB contacts"), K2 ("CG contacts") that produce the connections to the gate structures in the peripheral region) and K3 ("CS contacts") that contact the source and drain regions in the peripheral region) are to be etched into the insulation layer and into the silicon nitride layer 50$d$. Upon employment of the polysilicon mask M as a hard mask, the etching of the insulation layer 55 is implemented selectively relative to polysilicon and to silicon nitride. As a result, the etching of the via holes K2 stops on the silicon nitride layer 50$d$ covering the gate stack. The etching of the via holes K1 and K3 leading to the doping zones 25$e$ and 45$e$, in contrast, stops on the monocrystalline semiconductor substrate 20. Due to the selected selectivity relative to silicon nitride, the via holes K1 in the cell field ZF form self-aligned relative to the gate structures 25 and 30. These are also referred to as "borderless contacts". In contrast to this, the via holes K3 to the gate structures 45 in the peripheral region PF are formed spaced.

Figure 2C:
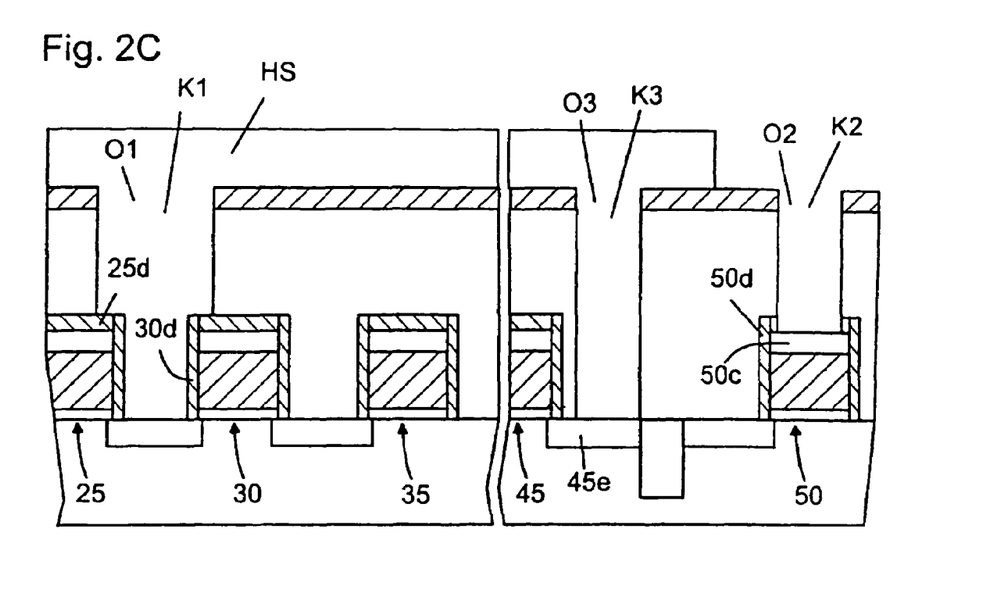

The via holes K2 are not yet completely finished since they only extend to the silicon nitride layer 50$d$. In order to etch this, an auxiliary layer HS via which the openings O2 in which an etching should ensue are selected is applied onto the polysilicon layer M. The openings O1 and O2, in contrast, are completely covered by the auxiliary layer and thus protect the silicon nitride layer 25$d$ and 30$d$ uncovered in the via holes K1. The silicon nitride layer 50$d$ at the floor of the via holes K2 is removed with the subsequent etching of silicon nitride relative to the polysilicon and the material of the auxiliary layer HS. The structure obtained in this way is shown in FIG. 2C.

An advantage of this approach is that only a single mask is required for the etching of different via holes and different materials. The hard mask M, accordingly, is the only structuring mask that need by structured using a high-resolution lithography. Since only a single lithography step is required, all via holes are aligned relative to one another. A lithography with lower resolution, in contrast, can be employed for structuring the auxiliary layer HS, which can also be referred to as a selection mask, since the auxiliary layer itself does not provide structure.

Figure 2D:
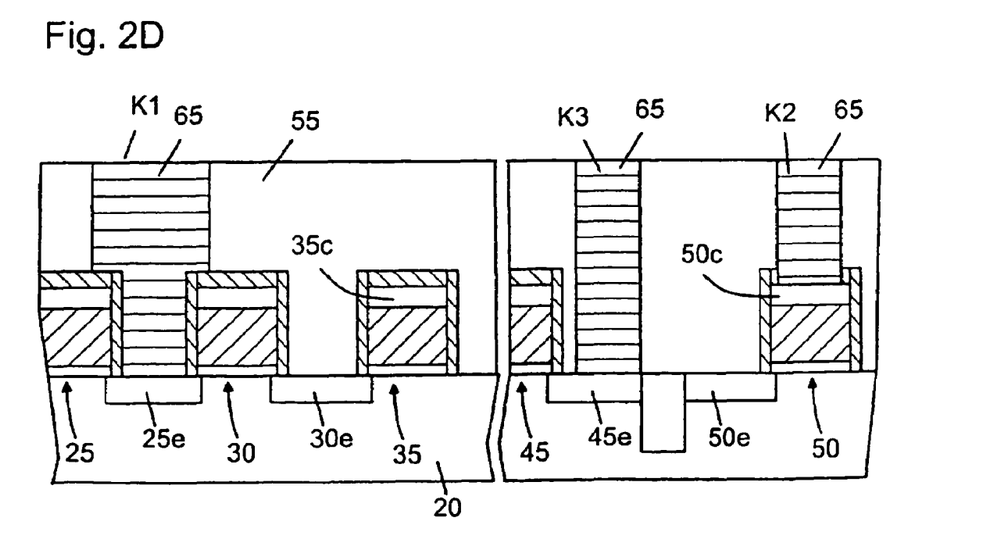

Finally, the via holes K1, K2 and K3 are filled with a conductive material 65, for example tungsten (FIG. 2D). As warranted, trenches for the interconnects of the M0 level can have been previously etched in the insulation layer, and these can be filled with the conductive material and polished back (the "Damascene process") together with the via holes.

Two specific examples for the etching chemistry employed when etching the polysilicon layer and the ARC layer are recited below. Both examples are suited for the structuring of a hard mask of polysilicon and subsequent structuring of a layer, as shown in FIGS. 1 and 2.

EXAMPLE 1

| Stage | 1 stabilization | 2 ARC | 3 Poly | 4 overetching poly | 5 pumping off |
|---|---|---|---|---|---|
| Pressure [Pa] | 7 | 7 | 10 | 10 | 0 |
| RF$_{upper}$ (TCP)[W] | 0 | 200 | 600 | 600 | 0 |
| RF$_{lower}$ (Bias)[W] | 0 | 120 | 50 | 50 | 0 |
| CF$_4$ [sccm] | 100 | 100 | 0 | 0 | 0 |
| Cl$_2$ [sccm] | 0 | 0 | 0 | 0 | 0 |
| NF$_3$ [sccm] | 0 | 0 | 0 | 0 | 0 |
| SF$_6$ [sccm] | 0 | 0 | 5 | 5 | 0 |
| HBr [sccm] | 0 | 0 | 190 | 190 | 0 |
| 70% He/O$_2$ [sccm] | 0 | 0 | 10 | 10 | 0 |
| End after | stabilization | end point recognition | end point recognition | prescribed time | prescribed time |
| End point reached after [s] | — | −55 | −36 | — | — |
| Max. time [s] | 20 | 60 | 42 | 5 | 5 |

-continued

| Stage | 1 stabiliza- tion | 2 ARC | 3 Poly | 4 overetching poly | 5 pumping off |
|---|---|---|---|---|---|
| Upper electrode temp. [° C.] | 60 | 60 | 60 | 60 | 60 |
| Chamber temp [° C.] | 60 | 60 | 60 | 60 | 60 |
| Lower electrode temp. [° C.] | 50 | 50 | 50 | 50 | 50 |
| Cooler temp. [° C.] | 50 | 50 | 50 | 50 | 50 |

Figure 3A:
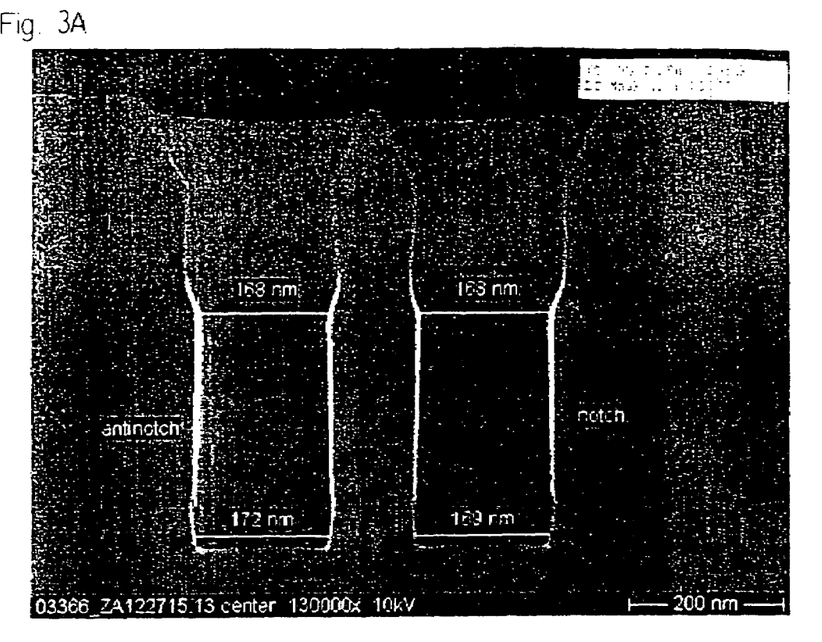
FIGS. 3A-3C are images showing SEM exposures of a polysilicon layer etched according to Example 1.
Figure 3B:
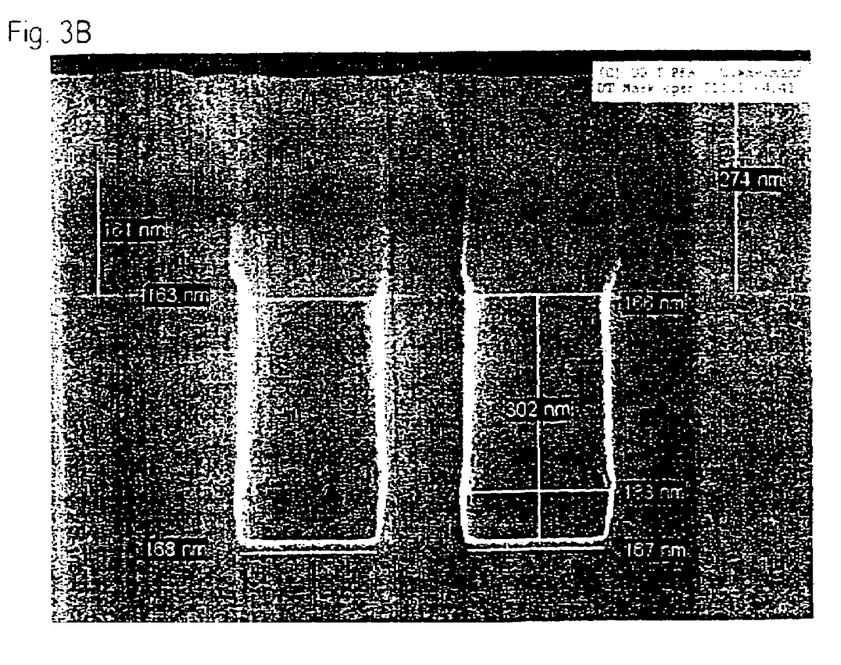
Figure 3C:
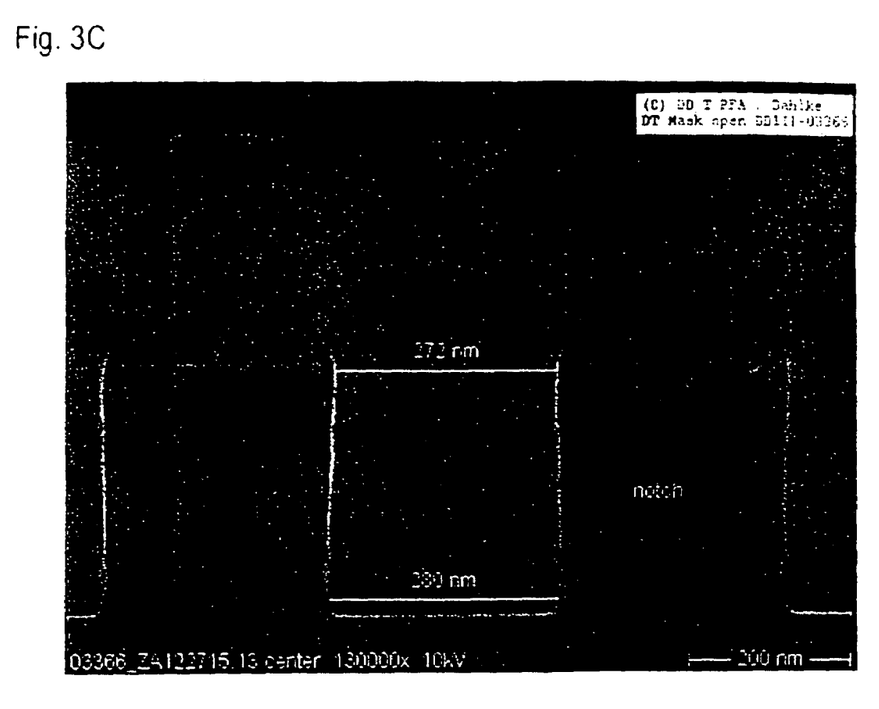

A high selectivity of polysilicon relative to the lacquer mask was achieved given the recited values. The sidewalls of the openings etched into the polysilicon layer are nearly vertical, as can be seen from FIGS. 3A through 3C in the scanning electron microscope (SEM) exposures. FIG. 3A shows a section perpendicular to the word lines to be formed for an integrated semiconductor memory, FIG. 3C being perpendicular to this. Both exposures reflect the situation in the center of the processed substrate. In contrast, FIG. 3B shows a section perpendicular to the word lines at the edge of the processed semiconductor substrate. The measured diameter of the openings etched into the polysilicon layer both at the upper end as well as at the lower end of this is shown in all Figures. It can be clearly seen that a uniform etching is present both in the center as well as at the edge of the semiconductor substrate.

A lithography with a smallest structure width of 140 nm was employed for the structuring in Example 1.

EXAMPLE 2

Since the time duration of the stage 5 is only known after the recognition of the end point, the time duration of stage 6 is not determined until afterwards.

Figure 4A:
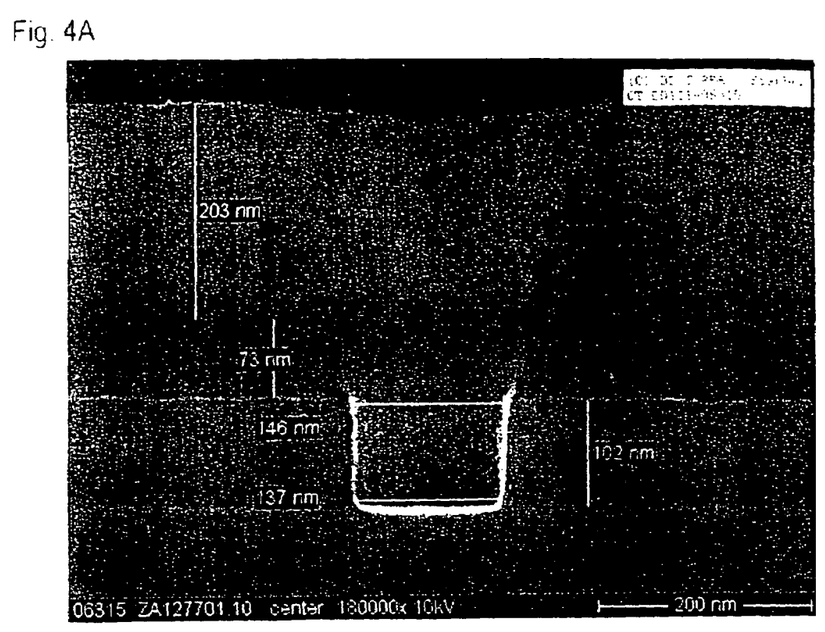
FIGS. 4A-4B are images showing SEM exposures of a polysilicon layer etched according to Example 2.
Figure 4B:
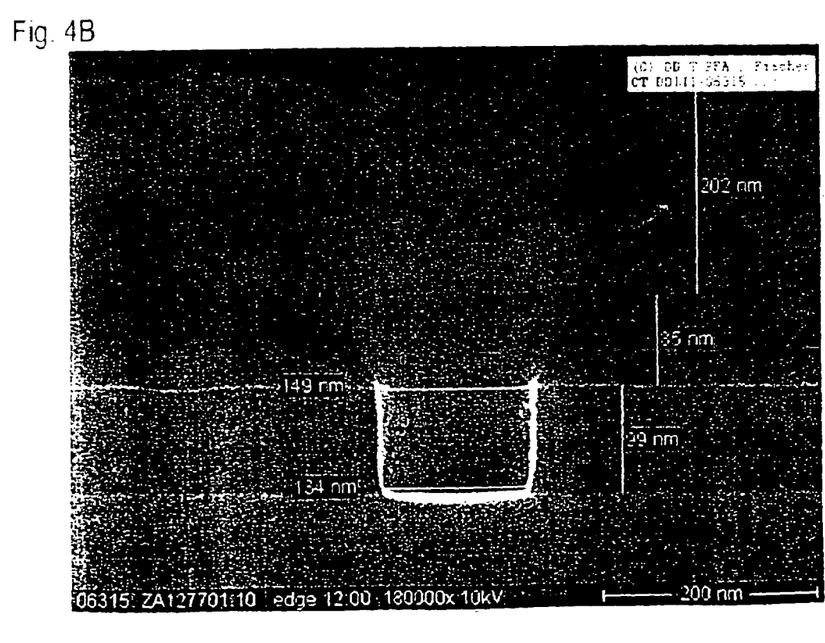

The etching implemented with these parameters was likewise investigated with a scanning electron microscope. FIGS. 4A and 4B show the results, where FIG. 4A shows the situation in the center and FIG. 4B shows the situation at the edge of the semiconductor substrate. The diameter of the openings etched into the polysilicon layer has again been shown. The openings were manufactured using a lithography whose smallest structure width is 110 nm. The sidewalls of the openings are largely vertical despite these extremely small dimensions.

The ARC layer comprises a thickness of 73 through 85 nm, the lacquer mask a thickness of 202 through 203 nm. A TCP etching chamber of the type LAM TCP 9400 of the LAM company was employed in both examples.

The etching of the polysilicon layer can ensue single-stage or multi-stage, whereby an end point recognition can be used for the time control of the etching process.

| Stage | 1 stabiliza- tion | 2 ARC end point | 3 ARC | 4 Poly | 5 Poly end point | 6 Poly over- etching |
|---|---|---|---|---|---|---|
| Pressure [Pa] | 7 | 7 | 7 | 10 | 10 | 10 |
| $RF_{upper}$ (TCP)[W] | 0 | 200 | 200 | 600 | 600 | 600 |
| $RF_{lower}$ (Bias)[W] | 0 | 120 | 120 | 50 | 50 | 50 |
| $CF_4$ [sccm] | 100 | 100 | 100 | 0 | 0 | 0 |
| $Cl_2$ [sccm] | 0 | 0 | 0 | 0 | 0 | 0 |
| $NF_3$ [sccm] | 0 | 0 | 0 | 0 | 0 | 0 |
| $SF_6$ [sccm] | 0 | 0 | 0 | 0 | 5 | 5 |
| HBr [sccm] | 0 | 0 | 0 | 190 | 190 | 190 |
| 70% $He/O_2$ [sccm] | 0 | 0 | 0 | 10 | 10 | 10 |
| End after | stabiliza- tion | end point recognition | prescrib- ed time | prescrib- ed time | end point recognition | prescribed time |
| End point reached after [s] | −15 | −36 | — | — | −102 | — |
| Max. time [s] | 20 | 42 | 7 | 10 | 150 | 15% |
| Upper electrode temp. [° C.] | 60 | 60 | 60 | 60 | 60 | 60 |
| Chamber temp [° C.] | 60 | 60 | 60 | 60 | 60 | 60 |
| Lower electrode temp. [° C.] | 50 | 50 | 50 | 50 | 50 | 50 |
| Cooler temp. [° C.] | 50 | 50 | 50 | 50 | 50 | 50 |

In stage 6, the time duration of the over-etching of polysilicon is based on the duration of stage 5. 15% of the time that was expended for the stage 5 is provided for the over-etching.

Figure 5A:
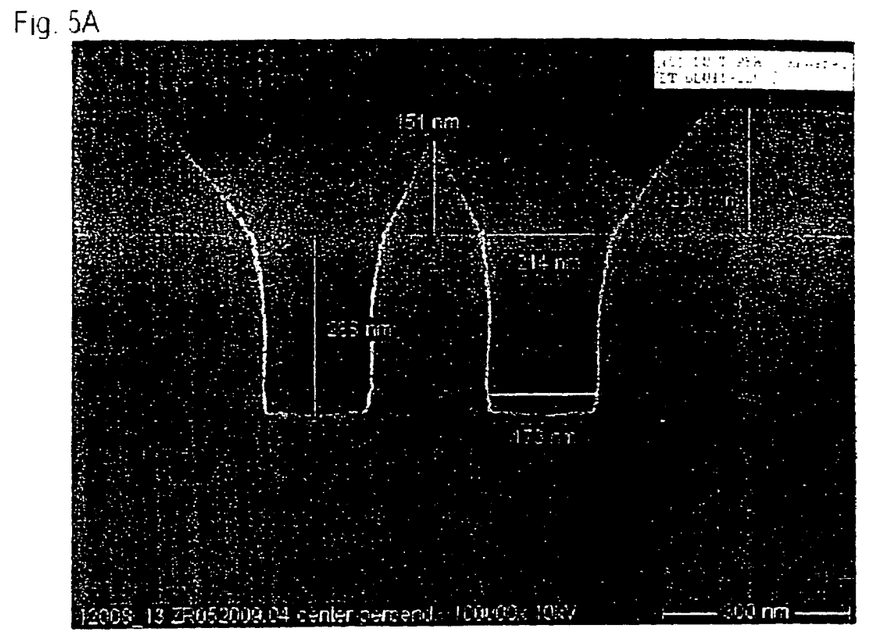
FIGS. 5A-5B are images showing SEM exposures of a polysilicon layer that was etched with a method known in the Prior Art.
Figure 5B:
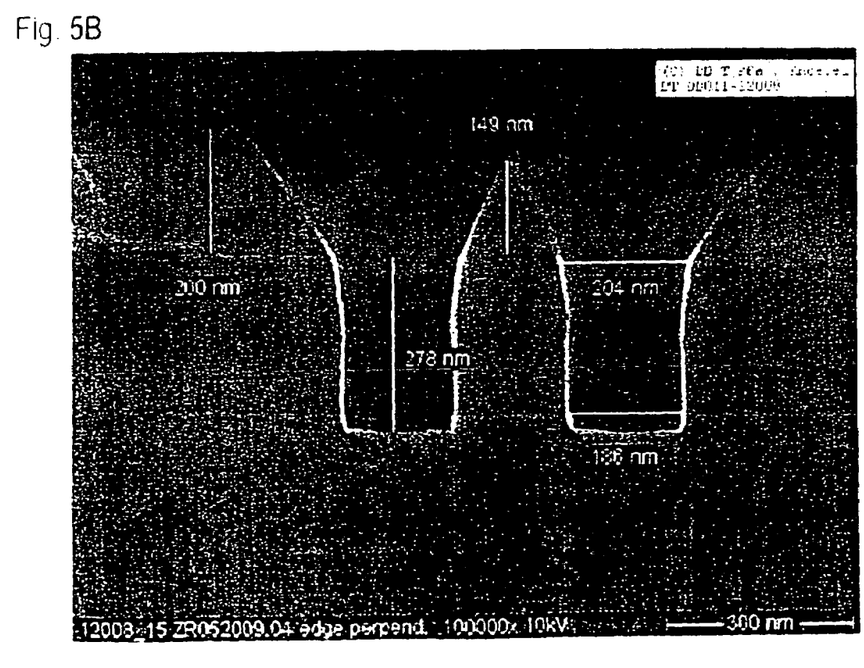

Compared to Examples 1 and 2, FIGS. 5A and 5B show openings etched into a polysilicon layer using an etching gas mixture known from the Prior Art that comprises HBr and $NF_3$. These openings were produced using a lithography with a 170 nm structure width. FIG. 5A shows a excerpt in the center, FIG. 5B an excerpt at the edge of the semiconductor substrate. The openings exhibit an increasingly larger diameter, particularly in the upper region. Together, the lacquer mask and ARC layer remaining after the etching have a thickness of about 200 nm. The overall thickness originally amounted to 530 nm (450 nm lacquer mask, 80 nm ARC). The great erosion of the lacquer mask is evident.

Figure 6:
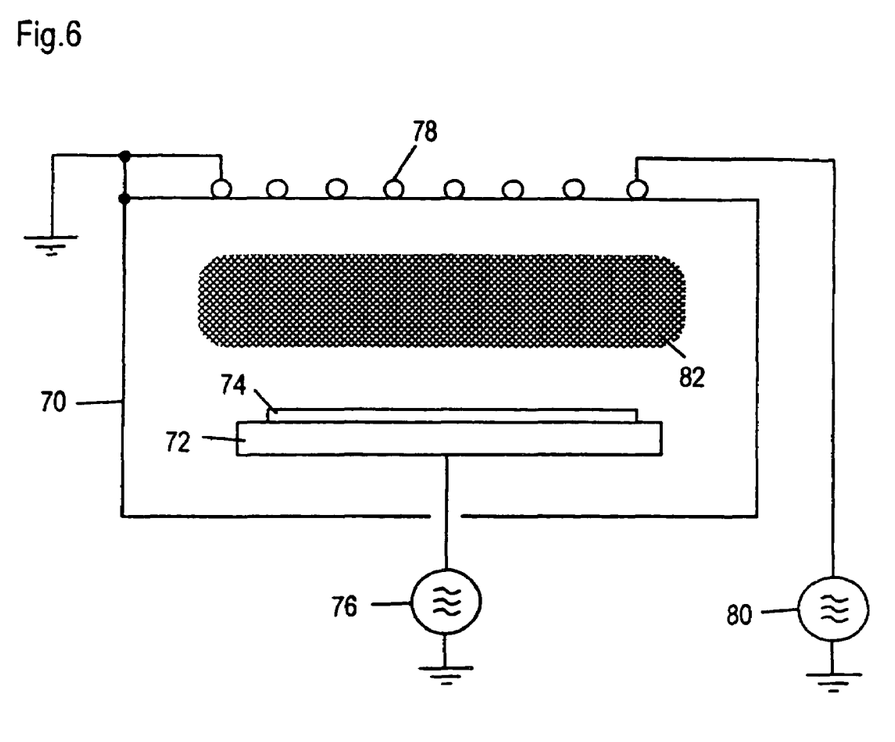
FIG. 6 is a schematic diagram of a TCP etching chamber.

FIG. 6 shows a schematic illustration of a TCP etching chamber. The housing 70 of the etching chamber is connected to ground. The substrate carrier 72, on which the semiconductor substrate 74 to be processed lies, is located within the housing 70. The substrate carrier 72, which is provided with a He cooling (not shown here) and simultaneously serves as lower electrode, is connected to a high-frequency source 76 that supplies an electrical bias power. The infeed coil 78 via which electrical power deriving from a high-frequency source 80 is coupled into the plasma 82 (TCP power), is located above the housing 70. The steepness of the sidewalls can be set by selecting the bias voltage that is supplied and the power that is inductively introduced. The values indicated in Examples 1 and 2 for the inductively introduced power and the bias power enable especially steep sidewalls. Other slope angles can be achieved by modifying these values. The infeed coil may simultaneously serve as an upper electrode.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art. The present invention may be described in terms of functional block components and various processing steps. Such functional blocks may be realized by any number of hardware components configured to perform the specified functions. The particular implementations shown and described herein are illustrative examples of the invention and are not intended to otherwise limit the scope of the invention in any way. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

LIST OF REFERENCE CHARACTERS

| | |
|---|---|
| 2 | substrate |
| 4 | pad oxide |
| 6 | pad nitride |
| 8 | BSG layer |
| 10 | layer to be structed |
| 12 | polysilicon layer |
| 14 | ARC layer |
| 16 | lacquer mask |
| 20 | semiconductor substrate |
| 25, 30, 35, 45, 50 | field effect transistors/gate structures |

-continued

LIST OF REFERENCE CHARACTERS

| | |
|---|---|
| 25a, 30a, 35a, 45a, 50a | gate dielectric |
| 25b, 30b, 35b, 45b, 50b | polysilicon layer |
| 25c, 30c, 35c, 45c, 50c | silicide layer |
| 25d, 30d, 35d, 45d, 50d | silicon nitride layer |
| 25e, 30e, 45e, 50e | doping zones |
| ZF | cell field |
| PF | peripheral region |
| 55 | insulation layer |
| M | polysilicon layer/hard mask |
| HS | auxiliary layer/selection mask |
| K1, K2, K3 | via holes |
| O1, O2, O3 | openings |
| 65 | conductive material |
| 70 | housing |
| 72 | substrate carrier with integrated He cooling/lower electrode |
| 74 | semiconductor substrate |
| 76 | high-frequency source/bias power |
| 80 | high-frequency source/TCP power |
| 78 | infeed coil/upper electrode |
| 82 | plasma |

What is claimed is:

1. A method for structuring a silicon layer, comprising:
    applying a lacquer mask onto the silicon layer;
    selectively etching the silicon layer relative to the lacquer mask utilizing an etching gas mixture consisting of $SF_6$, HBr and a mixture of He and $O_2$;
    setting a flow of $SF_6$ to between 3 and 7 sccm when etching the silicon layer;
    setting a flow of HBr to between 170 and 210 sccm when etching the silicon layer; and
    setting a flow of a mixture of He and $O_2$ to between 8 and 12 sccm when etching the silicon layer.

2. The method according to claim 1, further comprising providing, as the silicon layer, a polysilicon layer or an amorphous silicon layer.

3. The method according to claim 1, wherein the mixture of He and $O_2$ comprises a mixture of 70% He and 30% $O_2$.

4. The method according to claim 1, further comprising setting a pressure between 5 and 15 Pa when etching the silicon layer.

5. The method according to claim 1, wherein the etching of the silicon layer utilizes inductively coupled plasma etching.

6. The method according to claim 5, wherein the inductively coupled plasma etching inductively couples a power between 400 and 800 W.

7. The method according to claim 5, further comprising providing a bias power between 40 and 100 W.

8. The method according to claim 1, further comprising:
    applying an organic anti-reflection coat onto the silicon layer; and
    selectively etching the anti-reflection coat relative to the lacquer mask before applying the lacquer mask.

9. The method according to claim 8, wherein the anti-reflection coat is etched selectively relative to the lacquer layer utilizing an etching gas comprising $CF_4$.

10. The method according to claim 9, further comprising setting a flow of $CF_4$ to between 80 and 120 sccm when etching the anti-reflection coat.

11. The method according to claim 9, wherein the anti-reflection coat is etched only with $CF_4$.

12. The method according to claim 9, further comprising setting a pressure between 5 and 10 Pa when etching the anti-reflection coat.

13. The method according to claim 1, further comprising:
applying the silicon layer onto a layer to be structured;
forming a hard mask from the silicon layer by structuring utilizing the lacquer mask; and
etching the layer to be structured utilizing the silicon layer as a hard mask.

14. The method according to claim 13, further comprising removing the lacquer mask before the etching of the layer to be structured.

15. The method according to claim 13, further comprising:
covering, with the layer to be structured, a semiconductor substrate into which field effects transistors are integrated; and
etching via holes to gate structures and to doping zones arranged in the substrate into the layer to be structured.

16. The method according to claim 13, wherein openings in the silicon layer define a position of both the via holes leading to the gate structures as well as of the via holes leading to the doping zones, all openings of the silicon layer being etched by assistance of the lacquer mask.

17. The method according to claim 13, comprising at least two etching stages for etching the via holes to the gate structures and to the doping zones, wherein individual openings of the silicon layer are covered with an auxiliary layer in at least one of the etching steps.

18. The method for structuring a silicon layer as claimed in claim 1, wherein lower sidewalls are formed that are essentially vertical throughout a lower etched portion.

* * * * *